(12) United States Patent  (10) Patent No.: US 8,052,794 B2
Sumakeris et al.  (45) Date of Patent: Nov. 8, 2011

(54) DIRECTED REAGENTS TO IMPROVE MATERIAL UNIFORMITY

(75) Inventors: Joseph John Sumakeris, Apex, NC (US); Michael James Paisley, Garner, NC (US); Michael John O'Loughlin, Chapel Hill, NC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1207 days.

(21) Appl. No.: 11/224,374

(22) Filed: Sep. 12, 2005

(65) Prior Publication Data

US 2007/0065577 A1    Mar. 22, 2007

(51) Int. Cl.
C30B 15/00 (2006.01)
C30B 28/12 (2006.01)

(52) U.S. Cl. ............... 117/83; 117/84; 117/85; 117/86; 117/87

(58) Field of Classification Search ............... 117/83–87
See application file for complete search history.

(56) References Cited

U.S. PATENT DOCUMENTS

| | | | | |
|---|---|---|---|---|
| 3,424,628 A * | 1/1969 | Winings | | 438/508 |
| 4,722,911 A * | 2/1988 | Frijlink | | 117/93 |
| 4,748,135 A * | 5/1988 | Frijlink | | 117/102 |
| 4,860,687 A * | 8/1989 | Frijlink | | 118/500 |
| 4,961,399 A | 10/1990 | Frijlink | | |
| 4,976,217 A * | 12/1990 | Frijlink | | 118/733 |
| 5,027,746 A * | 7/1991 | Frijlink | | 118/724 |
| 5,056,555 A * | 10/1991 | Frijlink | | 137/522 |
| 5,108,540 A * | 4/1992 | Frijlink | | 117/98 |
| 5,226,383 A * | 7/1993 | Bhat | | 118/730 |
| 5,468,299 A * | 11/1995 | Tsai | | 118/730 |
| 5,558,721 A * | 9/1996 | Kohmura et al. | | 118/730 |
| 5,674,320 A * | 10/1997 | Kordina et al. | | 118/500 |
| 5,695,567 A * | 12/1997 | Kordina et al. | | 118/725 |
| 5,704,985 A * | 1/1998 | Kordina et al. | | 118/725 |
| 5,759,263 A * | 6/1998 | Nordell et al. | | 117/98 |
| 5,788,777 A * | 8/1998 | Burk, Jr. | | 118/730 |
| 5,792,257 A * | 8/1998 | Kordina et al. | | 117/90 |
| 5,858,102 A * | 1/1999 | Tsai | | 118/719 |
| 5,879,462 A * | 3/1999 | Kordina et al. | | 118/725 |
| 6,005,226 A * | 12/1999 | Aschner et al. | | 219/390 |
| 6,030,661 A * | 2/2000 | Kordina et al. | | 427/248.1 |
| 6,039,812 A * | 3/2000 | Ellison et al. | | 118/725 |
| 6,048,398 A * | 4/2000 | Vehanen et al. | | 117/200 |
| 6,063,186 A * | 5/2000 | Irvine et al. | | 117/89 |
| 6,093,253 A * | 7/2000 | Lofgren et al. | | 118/725 |
| 6,569,250 B2 | 5/2003 | Paisley et al. | | |
| 6,747,298 B2 | 6/2004 | Slater, Jr. et al. | | |
| 6,749,685 B2 | 6/2004 | Coleman | | |
| 6,797,069 B2 | 9/2004 | Paisley et al. | | |

(Continued)

*Primary Examiner* — Bob M Kunemund
*Assistant Examiner* — G. Nagesh Rao
(74) *Attorney, Agent, or Firm* — Steven B. Philips; Moore & Van Allen PLLC

(57) ABSTRACT

A method for locally controlling the stoichiometry of an epitaxially deposited layer on a semiconductor substrate is provided. The method includes directing a first reactant gas and a doping gas across a top surface of a semiconductor substrate and directing a drive gas and a second reactant gas against the substrate separately from the first reactant gas in a manner that rotates the substrate while introducing the second reactant gas at an edge of the substrate to control each reactant separately, thereby compensating and controlling depletion effects and improving doping uniformity in resulting epitaxial layers on the substrate.

32 Claims, 2 Drawing Sheets

U.S. PATENT DOCUMENTS

| | | |
|---|---|---|
| 6,811,614 B2 | 11/2004 | Käppeler et al. |
| 6,824,611 B1 * | 11/2004 | Kordina et al. ............... 117/107 |
| 6,896,738 B2 | 5/2005 | Sumakeris et al. |
| 7,118,781 B1 * | 10/2006 | Sumakeris et al. ........ 427/248.1 |
| 7,368,018 B2 * | 5/2008 | Yamaguchi ................... 118/730 |
| 2001/0002948 A1 * | 6/2001 | Aschner et al. ............... 392/418 |
| 2003/0188687 A1 * | 10/2003 | Paisley et al. ................. 118/730 |
| 2004/0060518 A1 | 4/2004 | Nakamura et al. |

* cited by examiner

US 8,052,794 B2

DIRECTED REAGENTS TO IMPROVE MATERIAL UNIFORMITY

BACKGROUND OF THE INVENTION

The present invention relates to methods and apparatus for depositing epitaxial layers on wafers and other substrates, and more particularly, to improving the doping uniformity and related qualities of such layers.

The semiconductor industry employs crystal growth from vapor, in particular, for producing epitaxial layers on semiconductor wafers. The term epitaxy typically describes the growth of a monocrystalline layer on the planar boundary surface of a monocrystalline substrate, generally a substrate wafer of a semiconductor material.

Epitaxial growth is often carried out using chemical vapor deposition (CVD) in CVD reactors. In such processes, the semiconductor wafer is first heated and then exposed to a gas mixture, referred to as a process gas. The process gas mixture typically consists of a reactant gas, a carrier gas, and, where appropriate, a dopant gas. The reactant gas (or gases) provides the elements that form the desired epitaxial layer; e.g. silicon from silane and carbon from propane to form silicon carbide. The dopant gases carry elements, typically as compounds, that add p or n-type conductivity to the epitaxial layer; e.g. nitrogen to obtain n-type silicon carbide. The reactant and dopant gases react on or near the hot substrate surface to form the desired epitaxial layer.

In a typical CVD process, reactant gases at room temperature enter the reaction chamber. The gas mixture is heated as it approaches the deposition surface, for example, by radiative heating or by coming into contact with a heated surface. Depending on the process and operating conditions, the reactant gases may undergo homogeneous chemical reactions in the vapor phase before striking the surface. Near the surface, thermal, momentum, and chemical concentration boundary layers form as the gas stream heats, slows down due to viscous drag, and the chemical composition changes. Heterogeneous reactions of the reactant gases or reactive intermediate species (formed from homogeneous pyrolysis) occur at the deposition surface forming the deposited material. Gaseous reaction by-products are then transported out of the reaction chamber.

Commonly owned U.S. Pat. No. 6,569,250, incorporated entirely herein by reference, discloses a gas driven rotation apparatus for chemical vapor deposition of epitaxial layers on a semiconductor substrate. The previously described gas mixture enters the rotation apparatus from a location situated above the base portion. As the reactant gas mixture approaches the substrate surface, the reactant gases (after homogeneous chemical reaction, as previously described) are deposited on the substrate. Without being bound by theory, it is believed that the phenomenon of high dopant incorporation at the edge of wafers during standard epitaxial deposition is a result of a temperature gradient that exists across the wafer surface. Particularly, the edge of the wafer is almost always cooler than the center of the wafer, due to the greater surface area of the edge region. This greater surface area provides more directions for heat radiation than the center of the wafer.

A higher silicon to carbon ratio in the process gas may result in higher nitrogen (donor) dopant incorporation efficiency during silicon carbide growth, while a lower silicon to carbon ratio in the process gas may result in lower nitrogen dopant incorporation efficiency. The cooler edge regions of semiconductor wafers result in a higher effective silicon to carbon ratio on the wafer edge than the effective silicon to carbon ratio in the center of the wafer surface. Accordingly, the nitrogen dopant incorporation occurring at the center of the wafer may be lower that the nitrogen dopant incorporation at the wafer edge.

Doping changes in epilayers deposited on substrate wafers often lead to different performance among devices, such as Field Effect Transistors, that may be later fabricated on the wafer. Stated differently, because the doping levels in epilayers and wafers often exert some control over device performance, where multiple devices are fabricated on a single wafer, those devices will perform differently if the dopant levels are not substantially equal across the wafer surface. It would therefore be desirable to develop a method of depositing epitaxial layers substantially free of changes in the doping profile across the wafer surface.

SUMMARY

In one aspect, the invention is an apparatus for forming uniformly-doped epitaxial layers on a semiconductor substrate.

In another aspect, the invention is a method for locally controlling the stoichiometry of an epitaxially deposited layer on a semiconductor substrate.

In yet another aspect, the invention is a method for forming uniformly-doped epitaxial layers on a semiconductor substrate by introducing reactant gases to the substrate surface from more than one location.

In a different aspect, the invention is a method for forming uniformly-doped epitaxial layers on a semiconductor substrate by locally controlling the stoichiometry of the epitaxially deposited layer.

In another aspect, the invention is a method for forming uniformly-doped epitaxial layers on a semiconductor substrate by introducing a more silicon-rich reactant stream from one location in the reactor and introducing a more carbon-rich reactant stream from at least a second location in the reactor.

The foregoing and other objects and advantages of the invention and the manner in which the same are accomplished will become clearer based on the following detailed description taken in conjunction with the following drawings.

DETAILED DESCRIPTION

Figure 1:
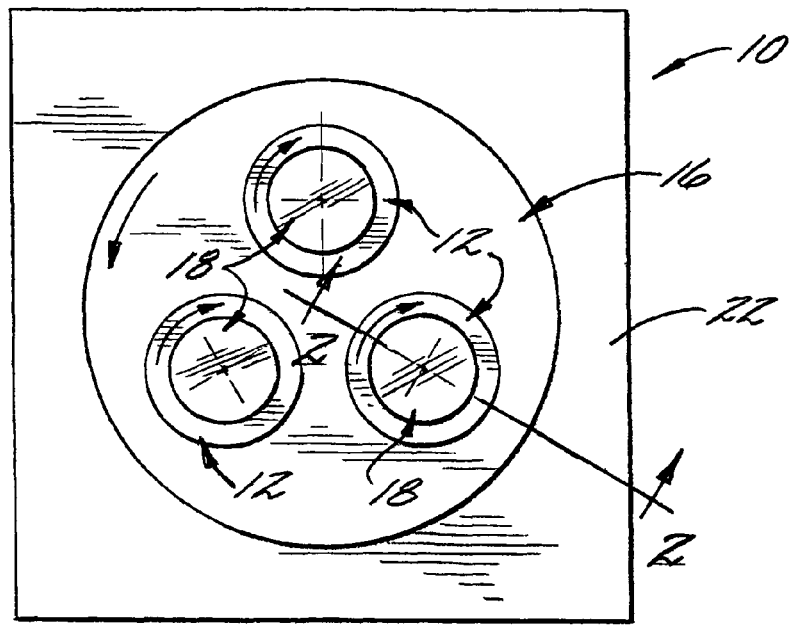
FIG. 1 is a partially schematic top plan view of an apparatus in accordance with the present invention.

The present invention is directed to the deposition of epitaxial layers on semiconductor substrates. More specifically, the present invention is directed to the deposition of uniformly-doped epitaxial layers on semiconductor substrates.

As used herein, the term "reactant" gas refers to a gas or gas mixture that will participate in a reaction that forms the desired epitaxial layer. Such reactions are often, but not exclusively, double displacement reactions and include gases such as propane and silane for forming SiC epilayers. The term "dopant" gas refers to a gas or gas mixture that carries (typically as compounds) elements that add p or n-type conductivity to the epitaxial layer. For example, a dopant gas may include an element such as nitrogen to provide n-type conductivity on a SiC substrate. The term "drive gas" refers to a gas or gas mixture that is substantially inert with respect to the reaction conditions of the reactor and the reactant and dopant gases in the reactor, and can serve to rotate the relative components of the reactor.

The invention will be described with reference to SiC epitaxial layer deposition. It should be understood, however, that the invention is not limited to SiC epitaxial layer deposition, but is applicable to epitaxial and non-epitaxial layer deposition in general. Reference is being made to SiC epitaxial deposition for ease of description. One skilled in the art will recognize the applicability of the invention to, for example, Group III-V epitaxial deposition as well as other epitaxial layers. Accordingly, epitaxial depositions recognized by those skilled in the art as applicable to the present invention are contemplated herein. The invention can be useful for growing compound semiconductors because the separate introduction of reagents allows a more direct control over the relative concentrations and compositions of the source gases across the substrate. This allows for more general applications such as III-nitrides, II-V compositions, II-VI compositions, and other possibilities.

In a broad sense, the invention is an apparatus for forming uniformly doped epitaxial layers on a substrate. The apparatus includes a first gas channel positioned to direct a first reactant gas and a doping gas across a top surface of a semiconductor substrate situated in a reactor. The apparatus also includes a second gas channel positioned to direct a drive gas and a second reactant gas against the substrate separately from the first reactant gas in a manner that rotates the substrate while introducing the second reactant gas at an edge of the substrate to control each reactant separately and thereby compensate and control depletion effects and improve doping uniformity in resulting epitaxial layers on the substrate.

In one embodiment, the present invention is an apparatus for forming uniformly-doped epitaxial layers on a substrate. With respect to FIGS. 1 and 2, the apparatus includes a reactor schematically illustrated at 10, preferably a hot-wall reactor, including therein at least one satellite 12 positioned in an indented portion 23 of a platter 16 for positioning substrates 18 for epitaxial deposition. The satellite 12 is positioned such that it levitates and rotates relative to the platter 16 when a drive gas is passed through a first drive gas channel 20 that in the illustrated embodiment is defined by the space between the satellite 12 and the platter 16. The platter 16 is positioned on an indented top surface 21 of a base member 22 and is configured for positioning multiple satellites 12. The base member 22 may include liners as described in U.S. Patent Application Publication No. 20030079689, the contents of which are incorporated entirely herein by reference. The platter 16 includes a second drive gas channel 24 in communication with a bottom surface 26 of the platter 16 and a top surface 21 of the base member 22. The vertical passage 29 in the platter 16 permits some fraction of the drive gas in the second drive gas channel 24 to pass into the first drive gas channel 20, thereby accomplishing planetary rotation. The invention is not limited to this particular configuration as there may also be only one rotating member. Also, if multiple rotating members are employed, then multiple, independent drive gas supplies can also be employed. The platter 16 is positioned such that it levitates and rotates relative to the base member 22 when a drive gas is passed through the second drive gas channel 24. The second drive gas channel 24 is in further communication with the indented top surface 21 of the base member 22 and a drive gas entrance channel, schematically illustrated as the arrow 28, which extends through the base member 22 of the reactor 10 and connects to the second drive gas channel 24. The drive gas entrance channel 28 is configured to include entrance for the drive gas and at least one reactant gas. The apparatus further includes a reactant gas entrance passage, schematically illustrated as the arrow 30 above the satellite 12 for introducing reactant gases to the reactor 10. The reactant gas entrance passage 30 is positioned relative to the satellite 12 such that the reactant gases travel across a top surface 32 of the satellite 12.

Figure 2:
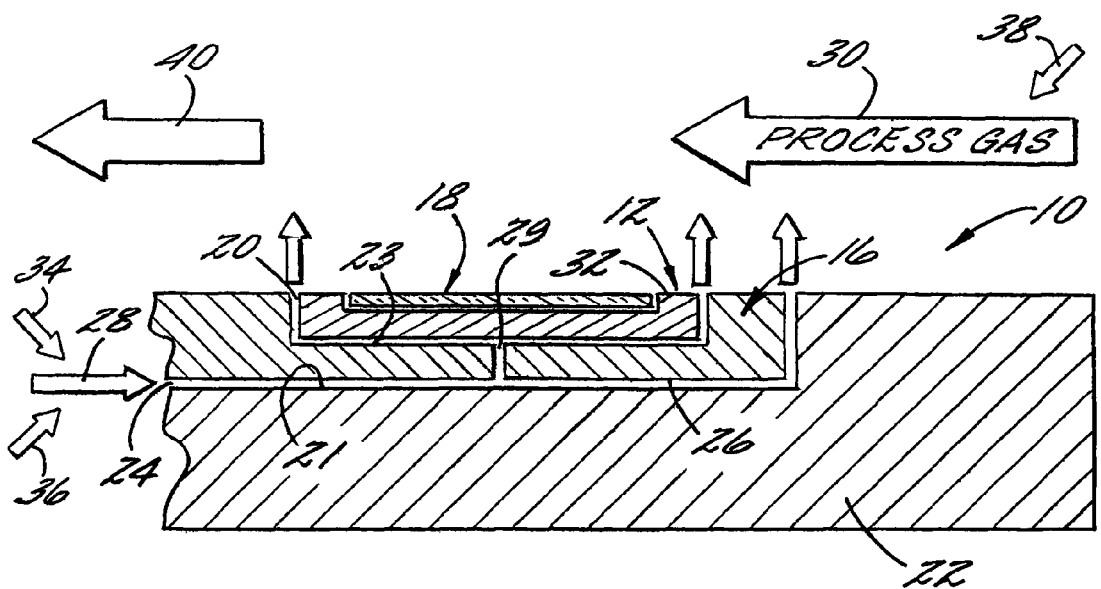
FIG. 2 is a cross section of the apparatus taken along line 2-2 of FIG. 1.

In a preferred embodiment, the apparatus includes more than one satellite 12 positioned on the platter 16, with the first drive gas channel 20 being positioned such that it is in communication with each of the satellites 12. FIG. 1 illustrates three satellites 12. The invention, however is not limited to equipment with satellites and may also be employed in applications without separate satellites. The number of satellites 12 on the platter 16 is limited only by the geometry of the reactor and the space available within the reactor and on the platter surface.

The apparatus may further include a spindle (not shown) between the platter and base member to further control rotation of the base member and platter about a single axis. Spindles also can be used between platter and satellites The apparatus may further include a separate drive-gas supply device, schematically illustrated as the arrow 34 for providing a flow of drive gas through the drive gas entrance channel 28, as well as a reactant gas supply device, schematically illustrated as the arrow 36, for providing a flow of reactant gas through the drive gas entrance channel 28. An additional reactant gas supply device, schematically illustrated as the arrow 38 may also be provided to provide a flow of reactant gas through the reactant gas entrance passage 30. The apparatus may also include an exhaust passage, schematically represented as the arrow 40 for exhausting reactant gases and drive gas, as well as gaseous reaction by-products, from the reactor after epitaxial deposition.

Reactor assemblies according to the present invention may incorporate any of the features and aspects as described in commonly-owned U.S. Pat. Nos. 6,569,250 and 6,797,069, as well as U.S. patent application Ser. No. 10/017,492, the disclosures of which are incorporated herein by reference in their entirety.

In another embodiment, the invention is a method for controlling reactant stoichiometry and forming uniformly-doped epitaxial layers on a substrate. The method includes directing a first reactant gas and optionally a doping gas across a top surface of a semiconductor substrate and directing a drive gas and a second reactant gas against the substrate separately from the first reactant gas in a manner that rotates the substrate while introducing the second reactant gas at an edge of the substrate to control each reactant separately, thereby compensating and controlling depletion effects and improving doping uniformity in resulting epitaxial layers on the substrate.

Potentially, one of the source gases could include a portion of molecules that simultaneously introduce silicon and carbon, such as methyltrichlorosilane.

In a preferred embodiment, the first reactant gas is a silicon-rich reactant gas. With reference to SiC epitaxial layers, for example, the first reactant gas may be chosen from silane, disilanes, halo-silanes, and combinations thereof. The first reactant gas may be a mixture of gases, including the silicon-rich gases, as well as additional reactant gases, such as carbon-rich gases Dopants are preferably selected for their acceptor or donor introduction properties. Donor dopants are those which introduce n-type conductivity and acceptor dopants are those which introduce p-type conductivity in the semiconductor material. With reference to SiC epitaxial layers, n-type dopant atoms include but are not restricted to N, P, As, Sb, and Bi. With further reference to SiC epitaxial layers, p-type dopants atoms include but are not restricted to B, Al, Ga, In, and Tl. These dopants may be included individually or in combination.

With reference to SiC epitaxial layers, a preferred second reactant, in accordance with the invention is a carbon-rich compound, such as propane, ethylene, methane, ethane, butane, pentane, hexane, heptane, and other hydrocarbons suitable for use in chemical vapor deposition systems, and combinations thereof. One of ordinary skill in the art would recognize the carbon-rich gases suitable for use in conjunction with the current invention. It will also be understood that the hydrocarbons above butane (i.e., pentane and higher) are liquids at standard temperature and pressure and are vaporized at elevated temperatures for use as reactant gases.

Hydrogen gas is contemplated as a drive gas in accordance with the present invention. In addition to its mechanical function, hydrogen can help prevent the formation of parasitic carbon deposits within passages. Without being bound by theory, however, it may be desirable to use Ar or like gases (e.g., other noble gases) as the drive gas because such gases are less likely than $H_2$ gas to pick up impurities such as B, Al, Ti, Cr, and V from graphite, for example, and redeposit these impurities, for example onto the wafer surface. The thermal conductivity of Ar gas is, however, substantially less than that of $H_2$ gas. As a result, Ar gas present in the reactant gas flow may slow the transfer of heat to the reactants, thereby creating irregularities in the temperature profile of the reactant gas flow. The apparatus may provide for exhaust of the drive gas with only minimal introduction of the drive gas into the first reactant gas stream, so that Ar gas may be used as the drive gas without jeopardizing the first reactant gas stream temperature profile. Argon can be advantageous in growth, e.g., U.S. Pat. No. 6,297,522. Also, some portion of hydrogen in the rotation gas line can be advantageous in minimizing the deposition of C inside the susceptor assembly, especially when using C sources other than methane.

In yet another embodiment, the invention is a method for forming uniformly-doped epitaxial layers on a substrate. The method includes positioning a substrate on a top surface of a satellite in a reactor, preferably a hot-wall reactor, for epitaxial deposition. In an exemplary embodiment, the satellite is positioned such that at least a first drive gas channel is defined between a top surface of a platter and a bottom surface of the satellite. The bottom surface of the satellite is positioned on an indented top surface of a platter having at least a second drive gas channel in communication with the top surface of the platter and a bottom surface of the platter and through which a drive gas travels. In other embodiments the drive gas can be separately supplied to the platter and any satellites. A first reactant gas, usually including at least a carbon containing gas, a silicon-rich reactant gas as discussed above, and a doping gas, including the preferred dopant sources as previously discussed, are directed across a top surface of the substrate, while a drive gas and a second reactant gas, preferably a carbon containing reactant gas, as previously discussed, are directed through the second drive gas channel such that rotation of the platter is effected and the drive gas and second reactant gas are directed through the first drive gas channel such that the satellite is rotated relative to the rotation of the platter, thereby introducing the second reactant gas near the edge of the substrate.

The resulting epitaxial layer forms in a relatively carbon-rich atmosphere in the edge regions of the semiconductor wafer and in a relatively silicon-rich atmosphere in the center of the wafer. The epitaxial layer preferably has a substantially flat doping profile.

In a preferred embodiment, the substrate is positioned on a satellite that is coated with a metal carbide such as tantalum carbide or niobium carbide. The metal carbide coating prevents sublimation of components of the satellite that may later be undesirably deposited on the wafer surface.

In another embodiment, the invention is a method for forming uniformly-doped epitaxial layers on a substrate by including a substance (such as carbon) in an indented top surface (or moat) near a satellite, in gas communication with the growth environment, so that some portion of the gas in the growth environment and the substance meet and react at the elevated temperatures. The usual example is carbon which reacts with hydrogen gas at these temperatures to produce hydrocarbon species. One example is to pack graphite dust into a moat in the platter.

The method further includes positioning a substrate on the included substance and opposite the top surface of the satellite, such that the released source atoms or species are introduced to the substrate at an edge of the substrate. The method further includes positioning a bottom surface of the satellite on a top surface of a platter, such that the bottom surface of the satellite is in communication with the first drive gas channel and the bottom surface of the platter is in communication with at least a second drive gas channel through which a drive gas travels. The second drive gas channel is further in communication with a top surface of a base member. The method further includes directing a reactant gas, including at least a silicon-containing reactant gas as discussed above, and a doping gas, as previously discussed, across a top surface of the substrate, directing a drive gas through the second drive gas channel such that rotation of the platter relative to the base member is effected and the drive gas is directed through the first drive gas channel such that the satellite is rotated relative to the rotation of the platter.

The method further includes heating the reactor to transfer carbon from the carbon-containing substance into the gas phase, thereby introducing a carbon-containing reactant gas at the edge of the wafer substrate.

In a preferred embodiment, the satellite is coated with a tantalum carbide coating to prevent sublimation and later deposition of various impurities located in the satellite itself. The graphite dust packed into the moat according to this embodiment is preferably substantially free of any such undesired impurities.

The method preferably includes effecting epitaxial deposition on the top surface of the wafer. The resulting epitaxial layer is preferably grown in a relatively silicon-rich atmosphere in the center of the wafer and a relatively carbon-rich atmosphere on the edges of the wafer. The doping profile of the resulting epitaxial layer is preferably substantially flat, indicating uniform dopant incorporation across the wafer surface.

In another embodiment, the invention is a method for forming uniformly-doped epitaxial layers on a substrate, including positioning a substrate on a top surface of a satellite in a reactor for epitaxial deposition. The satellite is preferably positioned such that at least a first gas channel, through which a reactant gas travels, is defined between the bottom surface of the satellite and a top surface of a platter. The bottom surface of the satellite is preferably positioned on the top surface of the platter. The platter preferably includes a second gas channel through which a reactant gas travels, the second gas channel being in communication with the top surface of the platter and a bottom surface of the platter. The method preferably further includes mechanically rotating the platter and mechanically rotating the satellite relative to the rotation of the platter, directing a first reactant gas and a doping gas across a top surface of the substrate, and directing a second reactant gas through the first and second gas channels, thereby introducing the second reactant gas at an edge of the substrate.

In another embodiment, the invention is a method for forming uniformly-doped epitaxial layers on a substrate including positioning a substrate on a rotatable platform in a reactor for epitaxial deposition, directing a first reactant gas and a doping gas from a first gas inlet across a top surface of the substrate, and directing a second reactant gas from a second gas inlet across the top surface of the substrate. In a preferred embodiment, the method further includes rotating the platform, either by mechanical or gas-driven rotation, while concurrently directing the first and second reactant gases across the top surface of the substrate. The method also preferably includes directing the second reactant gas through a gas inlet that is positioned between the first gas inlet and the rotatable platform.

Without being bound by theory, it is believed that the substantially equal dopant incorporation in each of the described methods is effected by the balancing of the relatively high silicon to carbon ratio at the wafer center and the relatively low silicon to carbon ratio at the wafer edge with the relatively high substrate temperature at the wafer center to the relatively low wafer temperature at the wafer edge. The silicon-carbon ratio is controlled by the introduction of a primary reagent, in this case a carbon-containing reactant gas, at the wafer edge. This separate entry permits an additional degree of control over the inherent reagent depletion effects common to CVD reactors. This additional degree of control allows for compensation for depletion and dilution effects independently for each species.

EXAMPLES

Example 1

A measure of graphite dust was placed in the "moat" area (e.g., the indented top surface of a platter) to allow local introduction of a carbon rich gas through reaction with $H_2$ in the carrier gas at the wafer edge. After loading three wafers into the system, one wafer in the satellite surrounded by the dust and two wafers in satellites removed from the dust, SiC MESFET epitaxial structures were grown on all three wafers. The doping in the center of each wafer was approximately the same. The doping profiles, however, revealed a 6% average doping increase on the edge of the wafer processed while surrounded by the dust filled moat, while the wafers processed near standard moats demonstrated 12% and 16% dopant incorporation increase on the wafer edges, respectively. This example demonstrates the ability to locally control the stoichiometry, as well as the dopant incorporation levels, by introducing a second reactant near the wafer edge.

Example 2

Figure 3:
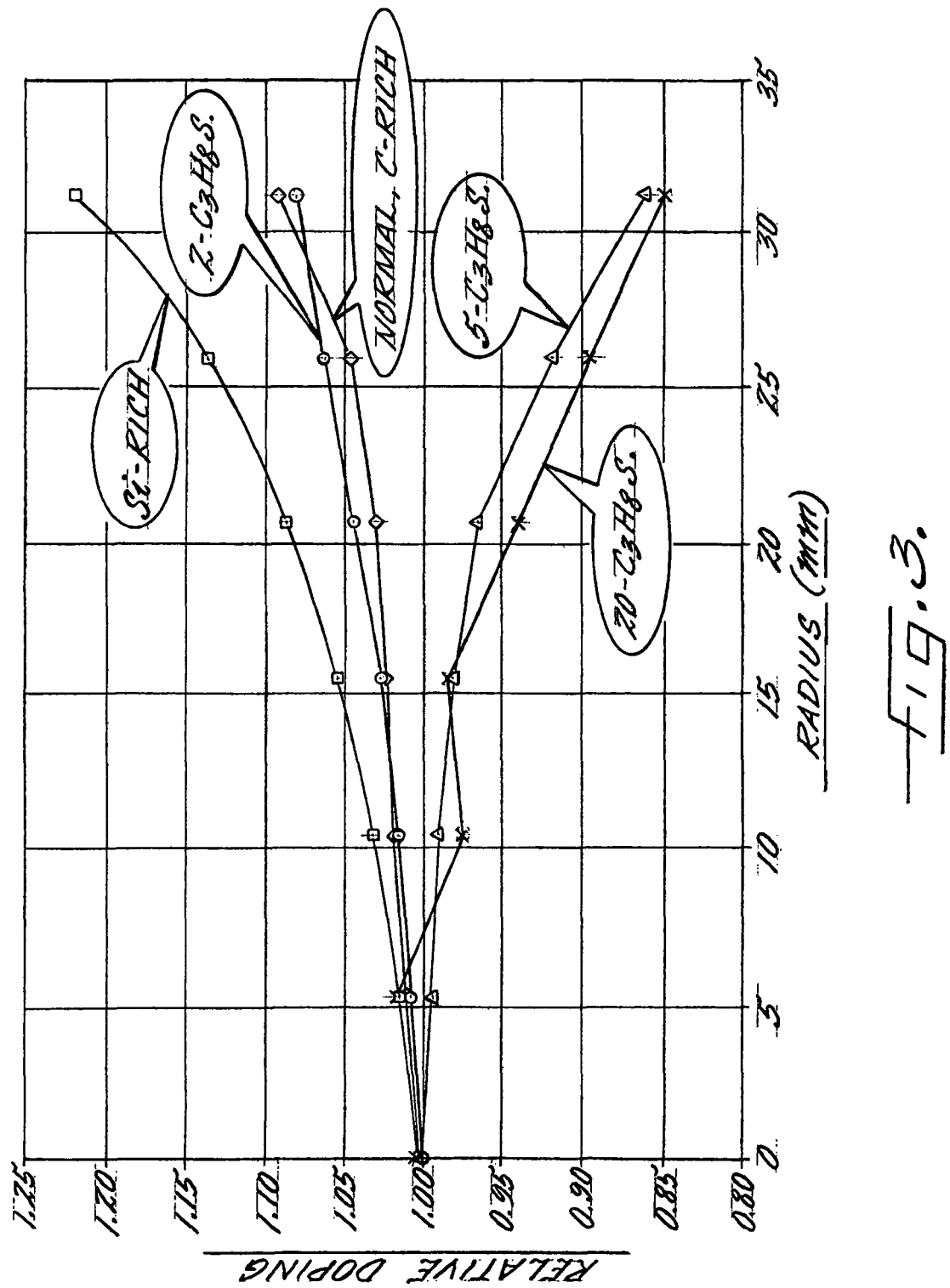
FIG. 3 is a graph representing the doping profile of epitaxial layers formed with a variety of stoichiometry control in accordance with the present invention.

With reference to FIG. 3, a series of tests were conducted, with a reaction environment ranging from silicon-rich to carbon-rich. FIG. 3 is a graph representing the cross-wafer doping profile of the various tests. The x-axis of the table represents the wafer radius in millimeters, with 0 being the center of the wafer and 35 being the perimeter of the wafer. The y-axis of the table represents relative nitrogen dopant incorporation. To take advantage of the improved stoichiometry control provided by the present invention, five different tests were run, beginning with a silicon-rich reactant stream, followed by including propane in the drive gas stream in amounts of 2, 5, and 20 sccm as seen in the respective curves. As is known in the art, sccm is the abbreviation for a standard cubic centimeter per minute. Stated differently, one sccm is one cubic centimeter of gas per minute at 0° C. and atmospheric pressure. As can be seen in FIG. 3, the cross wafer doping trend inverts between about 2 and 5 sccm of propane introduction, indicating that an optimal, or desirably flat, profile can be created within that range. The ability to invert the doping profile is an indication of the efficacy of the invention.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method for forming uniformly-doped epitaxial layers on a substrate, the method comprising:
    positioning a substrate on a top surface of a satellite in a reactor for epitaxial deposition, the satellite being positioned such that at least a first drive gas channel through which a drive gas travels is defined between the bottom surface of the satellite and a top surface of a platter;
    positioning the bottom surface of the satellite on the top surface of the platter having at least a second drive gas channel through which a drive gas travels, the second drive gas channel being in communication with the top surface of the platter and a bottom surface of the platter;
    directing a first gas flow containing a reactant gas and a doping gas across a top surface of the substrate;
    directing a drive gas and a second reactant gas through the second drive gas channel;
    directing the drive gas and the second reactant gas through the first drive gas channel; and
    rotating the platter and the satellite to introduce the second reactant gas from the second drive gas channel to the first drive gas channel and to the edge of the rotating substrate.

2. The method of forming uniformly-doped epitaxial layers on a substrate according to claim 1 wherein the step of positioning a substrate on a satellite comprises positioning a substrate on a satellite coated with tantalum carbide.

3. A method according to claim 1 further comprising directing a dopant gas through the drive gas channel.

4. The method of forming uniformly-doped epitaxial layers on a substrate according to claim 1 wherein the step of positioning the substrate, satellite, and platter in a reactor for epitaxial deposition comprises positioning the substrate, satellite, and platter in a hot-wall reactor.

5. The method of forming uniformly-doped epitaxial layers on a substrate according to claim 1 wherein the step of directing a reactant gas and a doping gas across a surface of a substrate comprises directing a relatively silicon-rich reactant gas across the surface of the substrate.

6. The method of forming uniformly-doped epitaxial layers on a substrate according to claim 5 wherein the step of directing a relatively silicon-rich reactant gas comprises directing silane gas.

7. The method of forming uniformly-doped epitaxial layers on a substrate according to claim 1 wherein the step of directing a doping gas comprises directing a doping gas comprising n-type dopant atoms.

8. The method of forming uniformly-doped epitaxial layers on a substrate according to claim 7 wherein the step of directing a doping gas comprising n-type dopant atoms comprises directing a doping gas including atoms selected from the group consisting of N, P, As, Sb, Bi, and combinations thereof.

9. The method of forming uniformly-doped epitaxial layers on a substrate according to claim 1 wherein the step of directing a doping gas comprises directing a doping gas comprising p-type dopant atoms.

10. The method of forming uniformly-doped epitaxial layers on a substrate according to claim 8 wherein the step of directing a doping gas comprising p-type dopant atoms comprises directing a doping gas including atoms selected from the group consisting of B, Al, Ga, In, Tl, and combinations thereof.

11. The method of forming uniformly-doped epitaxial layers on a substrate according to claim 1 wherein the step of directing a drive gas and a second reactant gas through the second drive gas channel comprises directing a drive gas selected from the group consisting of noble gases, hydrogen, and combinations thereof.

12. The method of forming uniformly-doped epitaxial layers on a substrate according to claim 1 wherein the step of directing a drive gas and a second reactant gas through the second drive gas channel comprises directing a drive gas that is inert with respect to the other reactants and the growing epitaxial layer.

13. The method of forming uniformly-doped epitaxial layers on a substrate according to claim 1 wherein the step of directing a drive gas and a second reactant gas through the second drive gas channel comprises directing a carbon-containing second reactant gas through the second drive gas channel.

14. The method of forming uniformly-doped epitaxial layers on a substrate according to claim 13 wherein the step of directing a carbon-containing second reactant gas comprises directing a gas selected from the group consisting of methane, ethylene, ethane, propane, butane, pentane, hexane, heptane, and combinations thereof.

15. The method of forming uniformly-doped epitaxial layers on a substrate according to claim 1 wherein the step of depositing a uniformly-doped epitaxial layer on the substrate comprises depositing an epitaxial layer in a relatively silicon-rich atmosphere near the center of the substrate surface.

16. The method of forming uniformly-doped epitaxial layers on a substrate according to claim 1 wherein the step of depositing a uniformly-doped epitaxial layer on the substrate comprises depositing an epitaxial layer in a relatively carbon-rich atmosphere near the edge of the wafer.

17. The method of forming uniformly-doped epitaxial layers on a substrate according to claim 1 wherein the step of depositing a uniformly-doped epitaxial layer on the substrate comprises depositing an epitaxial layer having a substantially flat doping profile.

18. A method for forming uniformly-doped epitaxial layers on a substrate, the method comprising:

positioning a substrate on a top surface of a satellite in a reactor for epitaxial deposition, the satellite being positioned such that at least a first gas channel through which a reactant gas travels is defined between the bottom surface of the satellite and a top surface of a platter;

positioning the bottom surface of the satellite on the top surface of the platter having at least a second gas channel through which a reactant gas travels, the second gas channel being in communication with the top surface of the platter and a bottom surface of the platter;

mechanically rotating the platter and mechanically rotating the satellite relative to the rotation of the platter;

directing a first reactant gas and a doping gas across a top surface of the substrate;

directing a second reactant gas through the first gas channel; and directing the second reactant gas through the second gas channel so that the second reactant gas is introduced from the second gas channel to the first gas channel and to an edge of the substrate.

19. The method of forming uniformly-doped epitaxial layers on a substrate according to claim 18 wherein the step of positioning a substrate on a satellite comprises positioning a substrate on a satellite coated with tantalum carbide.

20. A method according to claim 18 further comprising directing a dopant gas through the first and second gas channels.

21. A method according to claim 18 wherein the step of positioning the substrate, satellite, and platter in a reactor for epitaxial deposition comprises positioning the substrate, satellite, and platter in a hot-wall reactor.

22. The method of forming uniformly-doped epitaxial layers on a substrate according to claim 18 wherein the step of directing a reactant gas and a doping gas across a surface of a substrate comprises directing a relatively silicon-rich reactant gas across the surface of the substrate.

23. The method of forming uniformly-doped epitaxial layers on a substrate according to claim 18 wherein the step of directing a relatively silicon-rich reactant gas comprises directing silane gas.

24. The method of forming uniformly-doped epitaxial layers on a substrate according to claim 18 wherein the step of directing a doping gas comprises directing a doping gas comprising n-type dopant atoms.

25. The method of forming uniformly-doped epitaxial layers on a substrate according to claim 24 wherein the step of directing a doping gas comprising n-type dopant atoms comprises directing a doping gas including atoms selected from the group consisting of N, P, As, Sb, Bi, and combinations thereof.

26. The method of forming uniformly-doped epitaxial layers on a substrate according to claim 18 wherein the step of directing a doping gas comprises directing a doping gas comprising p-type dopant atoms.

27. The method of forming uniformly-doped epitaxial layers on a substrate according to claim 25 wherein the step of directing a doping gas comprising p-type dopant atoms comprises directing a doping gas including atoms selected from the group consisting of B, Al, Ga, In, Tl, and combinations thereof.

28. The method of forming uniformly-doped epitaxial layers on a substrate according to claim 18 wherein the step of directing a second reactant gas through the second drive gas channel comprises directing a carbon-containing second reactant gas through the second gas channel.

29. The method of forming uniformly-doped epitaxial layers on a substrate according to claim 28 wherein the step of directing a carbon-containing second reactant gas comprises directing a gas selected from the group consisting of methane, ethylene, ethane, propane, butane, pentane, hexane, heptane, and combinations thereof.

30. The method of forming uniformly-doped epitaxial layers on a substrate according to claim 18 wherein the step of depositing a uniformly-doped epitaxial layer on the substrate comprises depositing an epitaxial layer in a relatively silicon-rich atmosphere near the center of the substrate surface.

31. The method of forming uniformly-doped epitaxial layers on a substrate according to claim 18 wherein the step of depositing a uniformly-doped epitaxial layer on the substrate comprises depositing an epitaxial layer in a relatively carbon-rich atmosphere near the edge of the substrate.

32. The method of forming uniformly-doped epitaxial layers on a substrate according to claim 18 wherein the step of depositing a uniformly-doped epitaxial layer on the substrate comprises depositing an epitaxial layer having a substantially flat doping profile.

* * * * *

UNITED STATES PATENT AND TRADEMARK OFFICE
CERTIFICATE OF CORRECTION

| | | |
|---|---|---|
| PATENT NO. | : 8,052,794 B2 | Page 1 of 1 |
| APPLICATION NO. | : 11/224374 | |
| DATED | : November 8, 2011 | |
| INVENTOR(S) | : Joseph John Sumakeris, Michael James Paisley and Michael John O'Loughlin | |

It is certified that error appears in the above-identified patent and that said Letters Patent is hereby corrected as shown below:

On the cover page, "(73) Assignee:" change "The United States of America as represented by the Secretary of the Navy, Washington, DC (US)" to --CREE, Inc., Durham, NC (US)--

On the cover page, "(74) Attorney, Agent, or Firm:" change "Steven B. Philips; Moore & Van Allen PLLC" to --Steven B. Phillips; Moore & Van Allen PLLC--

On the cover page, "(56) References Cited" change the 23rd U.S. Patent Document from "6,039,812 A * 3/2000 Ellison et al. ................ 118/725" to --6,039,812 A 3/2000 Ellison et al. ................ 118/725--

Column 1, line 3, insert:

--STATEMENT OF GOVERNMENT INTEREST
This invention was developed under Office of Naval Research Government Contract No. N00014-02-C-0250. The government may have certain rights in this invention.--

Signed and Sealed this

Fourteenth Day of February, 2012

David J. Kappos
*Director of the United States Patent and Trademark Office*